United States Patent
Butt et al.

(10) Patent No.: US 9,230,637 B1
(45) Date of Patent: Jan. 5, 2016

(54) SRAM CIRCUIT WITH INCREASED WRITE MARGIN

(71) Applicant: GLOBALFOUNDRIES Inc., Grand Cayman (KY)

(72) Inventors: Shahid Ahmad Butt, Ossining, NY (US); Pamela Castalino, Hopewell Junction, NY (US); Harold Pilo, Underhill, VT (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/481,384

(22) Filed: Sep. 9, 2014

(51) Int. Cl.
*G11C 11/419* (2006.01)

(52) U.S. Cl.
CPC .................... *G11C 11/419* (2013.01)

(58) Field of Classification Search
CPC ....................................................... G11C 11/419
USPC ................................................ 365/154, 156
See application file for complete search history.

(56) References Cited

U.S. PATENT DOCUMENTS

| | | | | |
|---|---|---|---|---|
| 4,733,112 | A * | 3/1988 | Yamaguchi | 327/52 |
| 5,898,610 | A | 4/1999 | Greason | |
| 6,067,264 | A * | 5/2000 | Kwon | 365/203 |
| 6,510,076 | B1 | 1/2003 | Lapadat et al. | |
| 6,804,143 | B1 * | 10/2004 | Hobson | 365/154 |
| 6,862,207 | B2 | 3/2005 | Wei et al. | |
| 7,403,426 | B2 | 7/2008 | Hamzaoglu et al. | |
| 7,440,313 | B2 | 10/2008 | Abeln et al. | |
| 7,447,058 | B2 | 11/2008 | Maki et al. | |
| 7,449,753 | B2 | 11/2008 | Wang et al. | |
| 7,515,489 | B2 | 4/2009 | Wong | |
| 7,535,788 | B2 * | 5/2009 | Wu et al. | 365/226 |
| 7,586,806 | B2 | 9/2009 | Wong | |
| 7,653,846 | B2 * | 1/2010 | Kim et al. | 714/718 |
| 7,738,283 | B2 | 6/2010 | Wong | |
| 7,751,229 | B2 | 7/2010 | Dray et al. | |
| 7,848,130 | B1 | 12/2010 | Thummalapally et al. | |
| 7,852,661 | B2 | 12/2010 | Liu | |
| RE42,145 | E | 2/2011 | Hobson | |
| 7,898,875 | B2 | 3/2011 | Tao et al. | |
| 7,940,599 | B2 * | 5/2011 | Lu et al. | 365/230.05 |
| 7,969,759 | B1 | 6/2011 | Thummalapally et al. | |
| 8,130,579 | B2 * | 3/2012 | Kumar et al. | 365/203 |
| 8,144,501 | B2 | 3/2012 | Chen et al. | |
| 8,174,867 | B2 | 5/2012 | Wu | |
| 8,259,486 | B2 | 9/2012 | Kumar et al. | |

(Continued)

OTHER PUBLICATIONS

V. Asthana et al.; Circuit Optimization of 4T, 6T, 8T, 10T SRAM Bitcells in 28nm UTBB FD-SOI Technology Using Back-gate Bias Control; Proceedings of the ESSCIRC, 2013, pp. 415-418.

*Primary Examiner* — Viet Q Nguyen
(74) *Attorney, Agent, or Firm* — Heslin Rothenberg Farley & Mesiti P.C.

(57) ABSTRACT

Transistors are connected to ground outside of an SRAM array column. One transistor is connected from VSS to ground on the Q side of an SRAM cell. Another transistor is connected from VSS to ground on the Q' (Q complement) side of an SRAM cell. Each transistor is gated by is complementary bit line. The Q side transistor is gated by the BL' (bit line complement, or "BLC") line, and the Q' side is gated by the BL line. The ground of the complement side is disconnected during a write operation to increase the performance of a state change during a write operation where a logical one is written to the Q node, thus improving write margin.

12 Claims, 4 Drawing Sheets

(56) References Cited

U.S. PATENT DOCUMENTS

| | | |
|---|---|---|
| 8,310,894 B1 | 11/2012 | Su et al. |
| 8,320,198 B2 | 11/2012 | Thomas et al. |
| 8,363,453 B2 | 1/2013 | Arsovski et al. |
| 8,379,434 B2 | 2/2013 | Houston et al. |
| 8,379,435 B2 | 2/2013 | McMullan et al. |
| 8,441,874 B2 * | 5/2013 | Sinha et al. .................. 365/194 |
| 8,520,429 B2 | 8/2013 | Behrends et al. |
| 8,665,637 B2 * | 3/2014 | Ishikura et al. ............... 365/154 |
| 8,730,712 B2 * | 5/2014 | Choi ............................ 365/154 |
| 8,958,238 B2 * | 2/2015 | Sharma et al. ............... 365/156 |
| 9,030,893 B2 * | 5/2015 | Jung et al. ................ 365/189.16 |

* cited by examiner

SRAM CIRCUIT WITH INCREASED WRITE MARGIN

FIELD OF THE INVENTION

The present invention relates generally to semiconductor integrated circuits, and more particularly, to static random access memories (SRAMs).

BACKGROUND OF THE INVENTION

Static Random Access Memory (SRAM) is commonly used in integrated circuits, and have use in a variety of applications such as mobile computing, consumer electronics, and communications, to name a few. With the increasing performance requirements of these applications, the read speed and write speed of SRAM cells also becomes more important. Furthermore, sufficient read and write margins are required to achieve reliable read and write operations. With the increasingly reduced critical dimensions of SRAM cells, however, it is becoming challenging to achieve sufficient margin for read and write operations. It is therefore desirable to have improvements in SRAM circuits to address the aforementioned issues.

SUMMARY OF THE INVENTION

In a first aspect, embodiments of the present invention provide an electronic circuit comprising: a static random access memory (SRAM) cell; a bit line (BL) connected to the SRAM cell; a bit line complement (BLC) connected to the SRAM cell; a write driver connected to the BL and BLC; a first transistor connected between the SRAM cell and ground, wherein the first transistor is gated by the BL; and a second transistor connected between the SRAM cell and ground, wherein the second transistor is gated by the BLC.

In a second aspect, embodiments of the present invention provide electronic circuit comprising: a static random access memory (SRAM) cell; a bit line (BL) connected to the SRAM cell; a bit line complement (BLC) connected to the SRAM cell; a write driver connected to the BL and BLC; a first transistor connected between the SRAM cell and ground, wherein the first transistor is gated by the BL; a second transistor connected between the SRAM cell and ground, wherein the second transistor is gated by the BLC; a third transistor connected between the SRAM cell and ground; and a fourth transistor connected between the SRAM cell and ground, wherein the third transistor and fourth transistor are gated by an inverted write signal from an access control module.

In a third aspect, embodiments of the present invention provide an electronic circuit comprising: a static random access memory (SRAM) array comprising a plurality of SRAM cells; a bit line (BL) connected to the SRAM array; a bit line complement (BLC) connected to the SRAM array; a write driver connected to the BL and BLC; a first transistor connected between the SRAM cell and ground, wherein the first transistor is gated by the BL; and a second transistor connected between the SRAM cell and ground, wherein the second transistor is gated by the BLC.

BRIEF DESCRIPTION OF THE DRAWINGS

The structure, operation, and advantages of the present invention will become further apparent upon consideration of the following description taken in conjunction with the accompanying figures (FIGS.). The figures are intended to be illustrative, not limiting.

Certain elements in some of the figures may be omitted, or illustrated not-to-scale, for illustrative clarity. The cross-sectional views may be in the form of "slices", or "near-sighted" cross-sectional views, omitting certain background lines which would otherwise be visible in a "true" cross-sectional view, for illustrative clarity.

Figure 1:
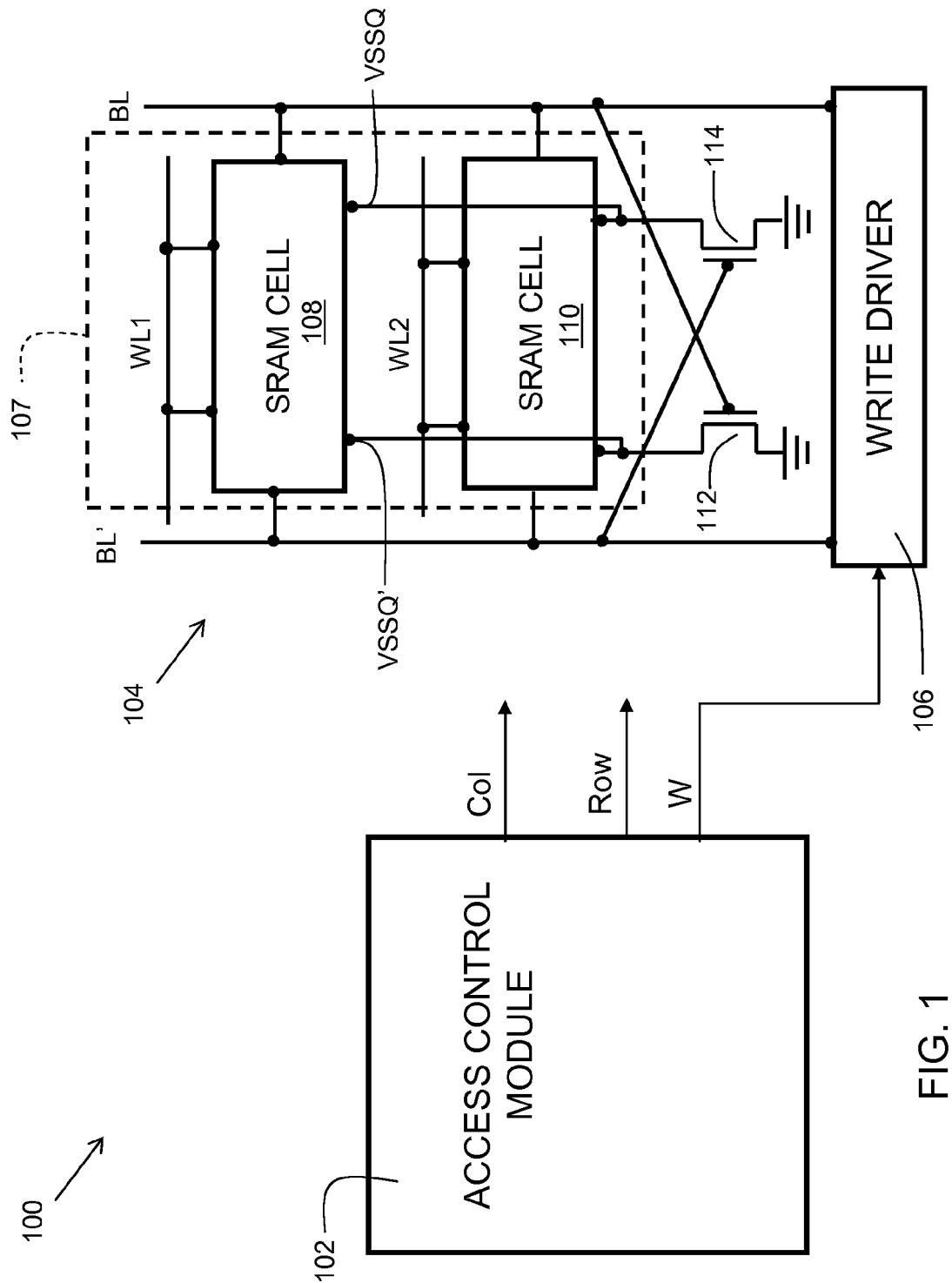

Often, similar elements may be referred to by similar numbers in various figures (FIGs) of the drawing, in which case typically the last two significant digits may be the same, the most significant digit being the number of the drawing figure (FIG). Furthermore, for clarity, some reference numbers may be omitted in certain drawings.

FIG. 1 is a block diagram of an embodiment of the present invention.

Figure 2:
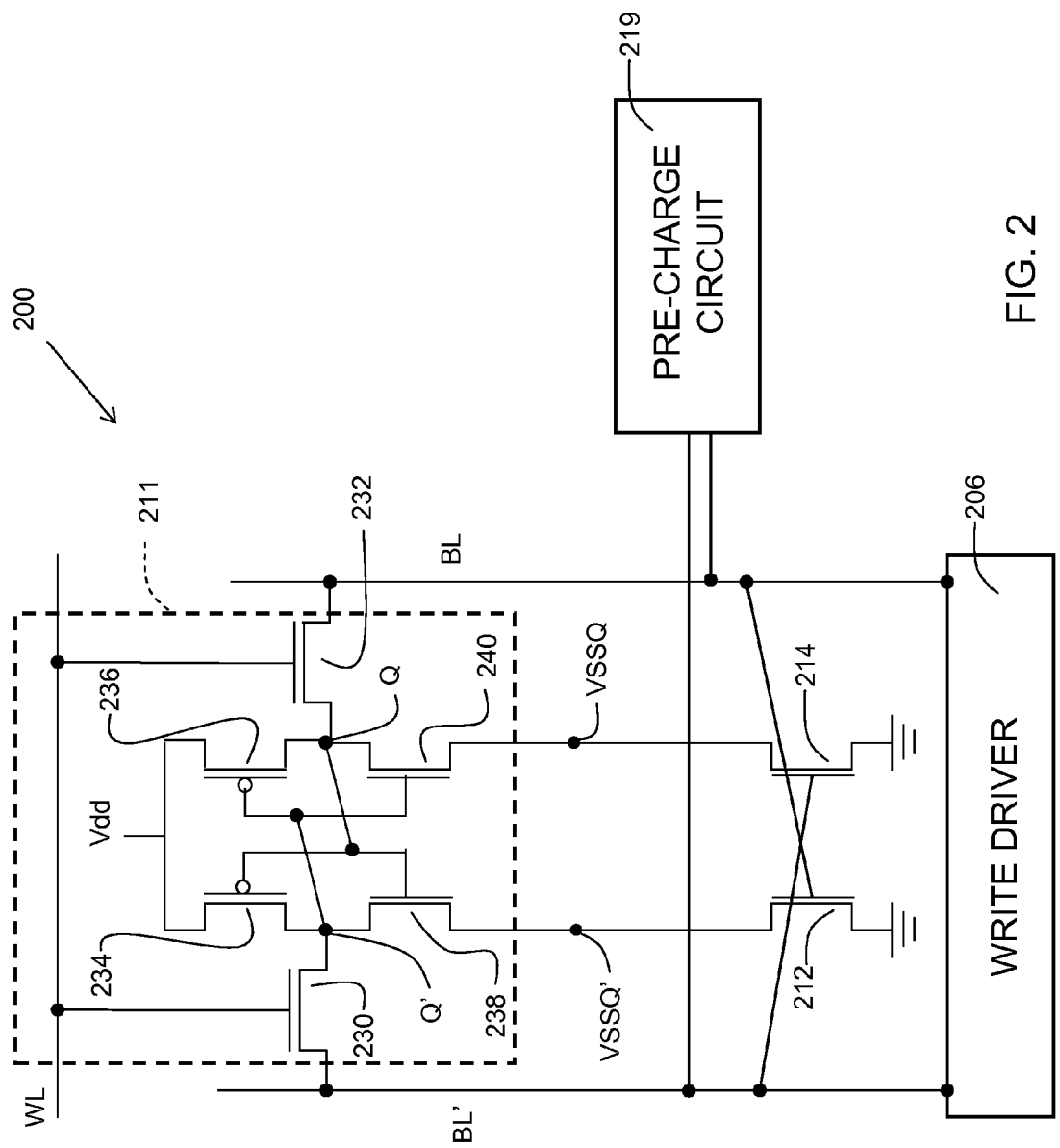

FIG. 2 is a schematic diagram of an embodiment of the present invention showing details of an SRAM cell.

Figure 3:
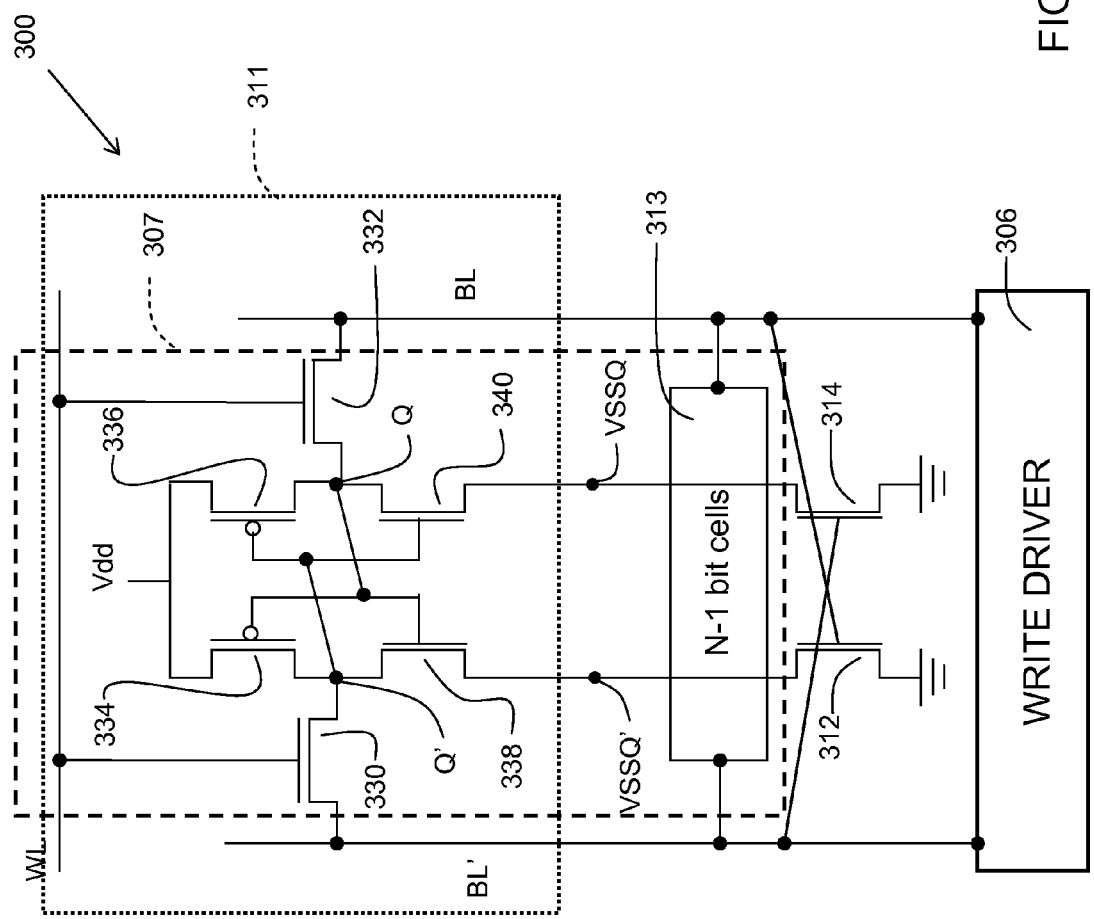

FIG. 3 is a schematic diagram of an embodiment of the present invention indicating multiple SRAM cells.

Figure 4:
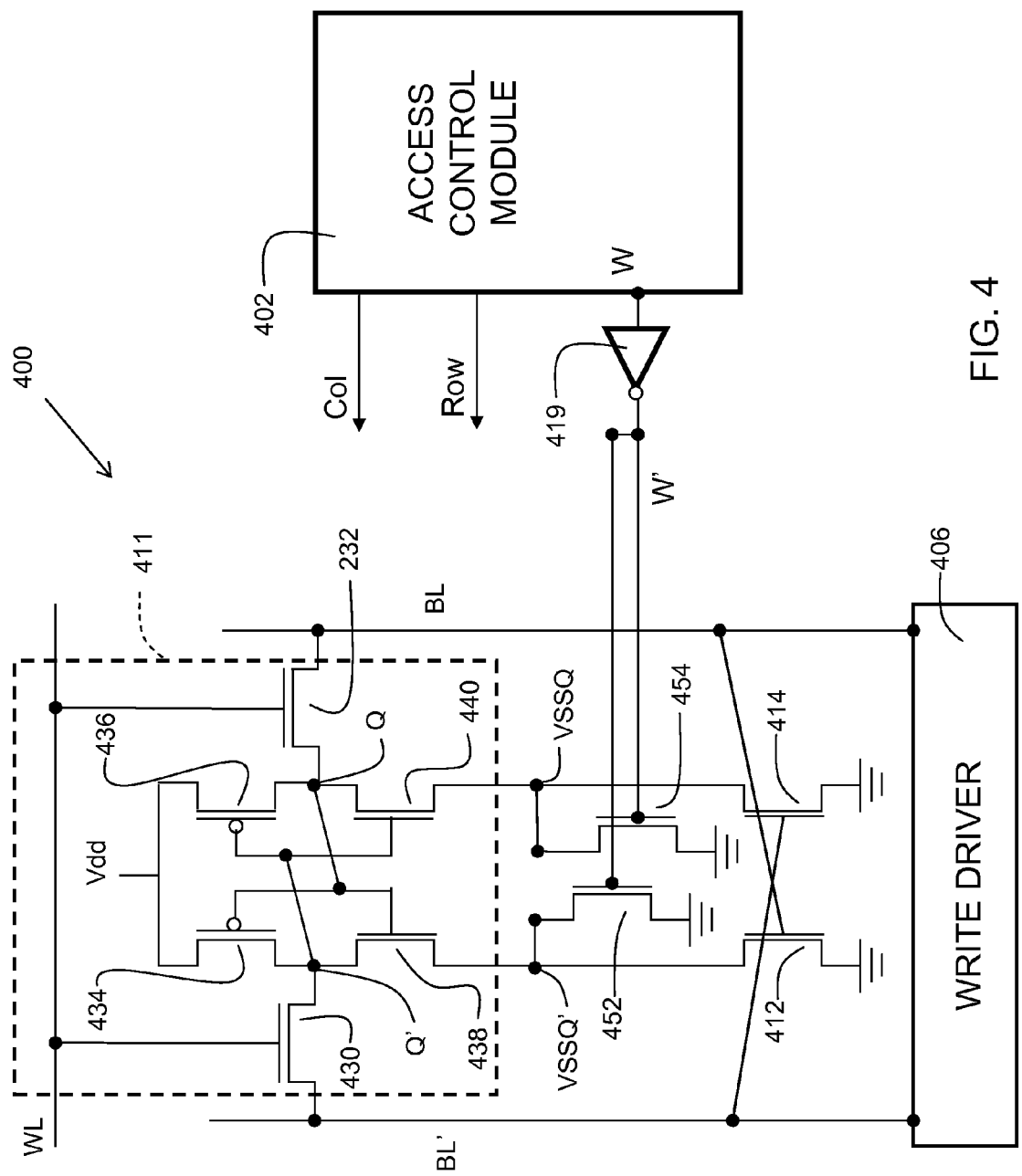

FIG. 4 is a schematic diagram of an alternative embodiment of the present invention.

DETAILED DESCRIPTION

Embodiments of the present invention provide a static random access memory (SRAM) electronic circuit providing increased write margin. Two transistors are connected to ground at the end of an SRAM array column. One transistor is connected from VSS to ground on the Q side of an SRAM cell. Another transistor is connected from VSS to ground on the Q' (Q complement) side of an SRAM cell. Each transistor is gated by is complementary bit line. The Q side transistor is gated by the BL' (bit line complement, or "BLC") line, and the Q' side is gated by the BL line. Thus, embodiments of the present invention provide a signal to the gate of transistors that connect the array VSS nodes to ground, such that the BL voltage regulates the connection between the array VSS nodes and ground. The ground of the complement side is disconnected during a write operation to increase the propensity for a state change during a write operation where a logical one is written to the Q node. Thus, when the Q node transitions from low to high during a write, the VSS of the Q side is disconnected from ground, making it easier for the SRAM cell to change state, and improved write margin is achieved.

FIG. 1 is a block diagram of a circuit 100 in accordance with an embodiment of the present invention. An access control module 102 provides address decoding for SRAM array 107. The access control module generates an appropriate column and row signal to activate corresponding word lines (WL1, WL2) and bit lines (BL/BL') for the array 107. Note that for simplicity, only two SRAM cells are shown (108 and 110) in a single column. In practice, there may be many millions of SRAM cells in an SRAM array, and comprising many rows and columns of SRAM cells. A write driver 106 is coupled to the bit line (BL) and bit line complement (BL') to store a new value in one of the SRAM cells (108 or 110) during a write operation. Outside of the array 107 are write assist transistors 112 and 114. The write assist transistors (WAT) are connected between ground and the VSS levels for the Q and Q' sides of the SRAM cells. Hence VSSQ represents the VSS node at Q, while VSSQ' represents the VSS node at Q'. Each WAT is gated by its complementary bit line. Thus, WAT 112 is gated by BL, while WAT 114 is gated by BL'. Note, the term "gated by BL" means that the BL signal is connected to the gate of the transistor 112, such that the state of BL determines if transistor 112 is in an on state or an off state. Similarly, the term "gated by BL'" means that the BL' signal is connected to the gate of the transistor 114, such that the state of BL' determines if transistor 114 is in an on state or an off state. The interaction of the WATs are explained in more detail in the following paragraphs.

FIG. 2 is a schematic diagram of a circuit 200 in accordance with embodiments of the present invention showing details of an SRAM cell 211. In this embodiment, SRAM cell 211 is a 6T cell (implemented with six transistors). However, embodiments of the present invention may utilize SRAM cells of 6T, 4T, 8T, 10T, and/or 12T. Other SRAM cell configurations are contemplated. Referring again to FIG. 2, SRAM cell 211 is a 6T cell, comprising N-type field effect transistor (NFET) pass gates 230 and 232, NFET 238 connected on one side to Q', and on the other side to VSSQ', and NFET 240 connected on one side to Q, and on the other side to VSSQ. P-type field effect transistor (PFET) 234 is connected to Q' on one side, and to Vdd on the other side. P-type field effect transistor (PFET) 236 is connected to Q on one side, and to Vdd on the other side. Nodes Q and Q' represent complementary nodes of a cross-coupled inverter. One bit of information (either a logical 1 or a logical 0) is stored at Q, while the complement is stored at Q'.

For a write operation, initially the word line (WL) is off, which causes pass gates 230 and 232 to also be in an off state, thus isolating the SRAM cell 211 from BL and BL'. For the sake of example, assume that initially, node Q stores a logical 0, and it is desired to write a logical 1 into node Q. Since node Q currently stores logical 0, node Q' currently stores a logical 1. Thus, pull-up transistor 234 is on, and pull-down transistor 238 is off, while pull-down transistor 240 is on, and pull-up transistor 236 is off. Initially, both bit lines (BL and BL') are precharged high by pre-charge circuit 219, and WAT 212 and 214 are both on, thus connecting ground with VSSQ' and VSSQ, respectively.

The pre-charge circuit 219 is disconnected and write driver 206 then brings BL' low (logical 0) and keeps BL high (logical 1) in order to write a 1 to node Q. As a result, WAT 214 transitions to an off state, thus isolating VSSQ from ground, while VSSQ' remains connected to ground through WAT 212. Since WAT 214 is off, node Q floats above ground enabling an easier transition of pull-up transistor 234 to the off state and pull-down transistor 238 to the on state compared to the conventional approach. Next, the word line (WL) is turned on, causing pass gates 230 and 232 to turn on, thus connecting BL' and BL to the SRAM cell 211. This causes the pull-down transistor 240 to be turned off, while pull-down transistor 238 gets turned on. Similarly, pull-up transistor 234 is shut off, while pull-up transistor 236 is turned on. Once the write operation is complete, the WL is turned off and both BL and BL' are precharged high, the WATs are both on, and VSSQ' and VSSQ are both connected to ground, providing stability when the SRAM cell is not being written to. In embodiments, the transistors used in implementation of the SRAM cell and WAT devices may be fin-type field effect transistors (finFETs), planar transistors, or a combination of both types. Furthermore, the transistors may be bulk transistors (where the transistor channel is located in a bulk silicon substrate, such as a silicon wafer), or the transistors may be semiconductor-on-insulator (SOI) transistors (where the transistor channel is formed in a thin semiconductor layer disposed over an insulator layer).

FIG. 3 is a schematic diagram of a circuit 300 in accordance with an embodiment of the present invention indicating multiple SRAM cells. In this embodiment, array 307 comprises multiple bit cells. Bit cell 311 is similar to bit cell 211 of FIG. 2. N−1 additional bit cells are in array 307, represented by block 313. For example, in a case where N=1024, there are 1023 bit cells in block 313, each bit cell being similar to bit cell 311. In this embodiment, SRAM cell 311 is a 6T cell (implemented with six transistors: 330, 332, 334, 336, 338, and 340). However, embodiments of the present invention may utilize SRAM cells of 6T, 4T, 8T, 10T, and/or 12T. Other SRAM cell configurations are contemplated. Note that as illustrate in FIG. 3, circuit 300 depicts a single column. However, in practice, there are many columns in the SRAM array, and the access control module (e.g. 102 of FIG. 1) performs the necessary address decoding to enable the appropriate word line and bit lines for desired SRAM cells.

FIG. 4 is a schematic diagram of a circuit 400 in accordance with an alternative embodiment of the present invention. Bit cell 411 is similar to bit cell 211 of FIG. 2. In this embodiment, SRAM cell 411 is a 6T cell (implemented with six transistors: 430, 432, 434, 436, 438, and 440). However, embodiments of the present invention may utilize SRAM cells of 6T, 4T, 8T, 10T, and/or 12T. Other SRAM cell configurations are contemplated. Circuit 400 further comprises access control module 402, which provides address decoding for the SRAM array (note that only one SRAM bit cell is shown in FIG. 4, but in practice there are many bit cells in the array). The access control module generates an appropriate column and row signal to activate corresponding word lines and bit lines (BL/BL'). Additionally, a write enable signal W is asserted during write operations. A pre-charge circuit (not shown) is coupled to the bit line (BL) and bit line complement (BL') to precharge BL and BL' prior to storing a new value in the SRAM cell 411 during a write operation. Write driver 406 sets BL and BL' to the desired logic level. Inverter 419 inverts write signal W to create complementary signal W'. Thus, when the write signal W is high, inverted write signal W' is low. Transistor 452 is gated by inverted write signal W', and connects VSSQ' to ground. Transistor 454 is also gated by inverted write signal W', and connects VSSQ to ground. Thus, in this embodiment, when write signal W (which is used for enabling the write driver 406) is low, inverted write signal W' is high. For a write operation, write signal W is asserted (high). For a read operation, write signal W is low, and inverted write signal W' is high. This causes transistors 452 and 454 to be in an on state, connecting VSSQ' to ground and VSSQ to ground. Thus, the transistors 452 and 454 provide a path to the ground during a read operation, potentially improving Access Disturb Margin (ADM). In embodiments, transistor 452 and transistor 454 may be NFET devices. In embodiments where the write signal W is asserted when low, then the inverted write signal W' is high during a write. In such an embodiment, PFET devices may be used for transistor 452 and 454.

Although the invention has been shown and described with respect to a certain preferred embodiment or embodiments, certain equivalent alterations and modifications will occur to others skilled in the art upon the reading and understanding of this specification and the annexed drawings. In particular regard to the various functions performed by the above described components (assemblies, devices, circuits, etc.) the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more features of the other embodiments as may be desired and advantageous for any given or particular application.

What is claimed is:

1. An electronic circuit comprising:
   a static random access memory (SRAM) cell;
   a bit line (BL) connected to the SRAM cell;
   a bit line complement (BLC) connected to the SRAM cell;
   a write driver connected to the BL and BLC;
   a first transistor connected between the SRAM cell and ground, wherein the first transistor is gated by the BL;
   a second transistor connected between the SRAM cell and ground, wherein the second transistor is gated by the BLC;
   a third transistor connected between the SRAM cell and ground; and
   a fourth transistor connected between the SRAM cell and ground, wherein the third transistor and fourth transistor are gated by an inverted write signal from an access control module.

2. The circuit of claim 1, wherein the first transistor and second transistor are planar transistors.

3. The circuit of claim 1, wherein the first transistor and second transistor are semiconductor-on-insulator transistors.

4. The circuit of claim 1, wherein the first transistor and second transistor are bulk transistors.

5. The circuit of claim 1, wherein the first transistor and second transistor are fin-type field effect transistors.

6. The circuit of claim 1, wherein the SRAM cell comprises a 6T cell.

7. The circuit of claim 1, wherein the SRAM cell comprises a 4T cell.

8. The circuit of claim 1, wherein the SRAM cell comprises a 8T cell.

9. The circuit of claim 1, wherein the SRAM cell comprises a 10T cell.

10. The circuit of claim 1, wherein the SRAM cell comprises a 12T cell.

11. The circuit of claim 1, wherein the third transistor and fourth transistor are N-type field effect transistors.

12. The circuit of claim 1, wherein the third transistor and fourth transistor are P-type field effect transistors.

* * * * *